(12) United States Patent
Tang

(10) Patent No.: US 7,714,432 B2
(45) Date of Patent: May 11, 2010

(54) CERAMIC/ORGANIC HYBRID SUBSTRATE

(75) Inventor: John Tang, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/206,246

(22) Filed: Jul. 26, 2002

(65) Prior Publication Data

US 2004/0016996 A1    Jan. 29, 2004

(51) Int. Cl.
*H01L 23/053* (2006.01)
*H01L 23/34* (2006.01)

(52) U.S. Cl. .................... 257/701; 257/700; 257/703; 257/724; 257/E23.173

(58) Field of Classification Search ............ 257/701, 257/703, 705, 724, 778, 779, 697, 700, E23.173; 174/256, 260; 361/760
See application file for complete search history.

(56) References Cited

U.S. PATENT DOCUMENTS

| | | | | |
|---|---|---|---|---|
| 4,227,039 A * | 10/1980 | Shibasaki et al. | .......... | 174/68.5 |
| 4,521,449 A * | 6/1985 | Arnold et al. | .......... | 427/96 |
| 5,288,944 A * | 2/1994 | Bronson et al. | .......... | 174/52.4 |
| 5,302,219 A * | 4/1994 | Hargis | .......... | 156/89 |
| 5,831,810 A * | 11/1998 | Bird et al. | .......... | 361/301.1 |
| 5,939,782 A * | 8/1999 | Malladi | .......... | 257/698 |
| 6,406,778 B1 * | 6/2002 | Natarajan et al. | .......... | 428/209 |
| 6,489,686 B2 * | 12/2002 | Farooq et al. | .......... | 257/777 |
| 6,528,145 B1 * | 3/2003 | Berger et al. | .......... | 428/156 |
| 6,553,660 B2 * | 4/2003 | Nakamura | .......... | 29/840 |

* cited by examiner

*Primary Examiner*—Nitin Parekh
(74) *Attorney, Agent, or Firm*—Kenyon & Kenyon LLP

(57) ABSTRACT

A semiconductor device is provided that includes one or more ceramic material layers and one or more low dielectric constant (low-K) epoxy layers on top to be electrically coupled to an integrated circuit device, such as a chip die. The resulting ceramic/organic hybrid substrate takes advantage of the thin low-cost, low-K epoxy layer, by routing the dense circuitry from the chip die to the ceramic material layer. In addition, the use of low-K epoxy layer may reduce the number of ceramic material layers required to about three layers, thus significantly reducing the cost of the substrate. Low-K epoxy material layer may be laminated onto the ceramic material layer to reduce throughput time and cost. The ceramic/organic hybrid substrate may also take advantage of the properties of ceramic materials, which have a much more rigid structure than organic materials and a low CTE (coefficient of thermal expansion) that works well with ultra low-K chip dies. The ceramic/organic hybrid substrate also may make possible the fabrication of a bottom cavity package for capacitors placement.

14 Claims, 4 Drawing Sheets

CERAMIC/ORGANIC HYBRID SUBSTRATE

BACKGROUND OF THE INVENTION

1. Field of the Invention

The present invention relates to semiconductor packaging and more particularly, to a method and apparatus for providing a high-performance, low-CTE (coefficient of thermal expansion), low-cost substrate, to interface with a low-K dielectric and integrated circuit without cracking.

2. Description of the Related Art

Semiconductor technology may be characterized as a quest to place more transistors on less space to achieve greater speed and performance. As integrated circuits and other semiconductor devices become faster, operating frequencies (i.e. clock speed in a microprocessor) also increase. At the same time, engineers and developers also strive to construct semiconductor devices that are more compact, therefore the distances between the conductive lines within the semiconductor device are being decreased accordingly.

The combination of higher operating frequencies and more compact circuitry results in an increased level of crosstalk, which is a disturbance caused by electromagnetic interference between the conductive lines. This interference may take the form of electromagnetic (inductive) or electrostatic (capacitive) coupling between the conductors. Crosstalk causes signal disruption in adjacent circuits and can cause the signals to be confused and cross over each other, all of which slows the operation of the semiconductor device. Therefore, it is extremely important to have dielectric layers that effectively insulate conductive lines against crosstalk.

In general, the amount of crosstalking between two conductive lines is proportional to the dielectric properties of the material insulating the lines. These properties may be measured to form a dielectric constant (K). The lower the dielectric constant, the better the insulator the material is. Integrated circuits conventionally include dielectric layers between conductive lines, typically comprised of silicon dioxide ($SiO_2$), which has a dielectric constant of about 4.0.

As a consequence of the increasing line densities and operating frequencies in integrated circuits, $SiO_2$ dielectric layers often do not have a low enough dielectric constant to provide adequate insulation. Therefore, in an effort to reduce crosstalk in integrated circuits, developers and engineers have attempted to develop insulating materials that have a much lower dielectric constant. A number of dielectric layers comprising organic materials, which are sometimes referred to as being "low-K" and "ultra low-K" dielectrics, have been developed. However, unlike conventional $SiO_2$ dielectric layers, low-K and ultra low-K dielectric materials often pose difficult implementation problems due to weak mechanical strength and low CTE.

A chip package typically includes an IC (e.g., in a chip die) connected to a chip carrier substrate, which interfaces the die to a motherboard socket. The main problem with using ultra low-K insulation in a chip package is that ultra low-K materials are brittle and weak compared to conventional $SiO_2$. Organic resin in the chip carrier (typically BT (bismaleimide-triazine), has a high coefficient of thermal expansion (CTE) of about 17 parts per million per degrees Celsius (PPM/° C.). A chip carrier with an ultra low-K dielectric typically has a CTE of only about 3 PPM/° C., there would be a significant CTE mismatch resulting from contact between an ultra low-K chip carrier substrate and a chip die.

The mismatch would apply a great deal of stress on the low-K dielectric layers of chip die. Since this material is extremely weak and brittle, there is a risk of dielectric cracking and delamination due to temperature cycling during fabrication processing and normal usage of the device. In contrast, when conventional $SiO_2$ dielectric layers are used, the chip die is strong enough to prevent problems that might result from the CTE mismatch. The introduction of an ultra low-K dielectric material poses a significant challenge on packaging technology to reduce the additional stress.

One conventional solution to the CTE mismatch problem is to use a chip package where the chip carrier substrate comprises a ceramic instead of an organic material. A ceramic substrate typically has a CTE of only about 6 to about 7 PPM/° C., resulting in a much lower CTE mismatch. Due to the strength of the chip die and the low CTE mismatch, no cracking will result. Unfortunately, ceramic dielectric layers have a much higher K than organic dielectric layers and will not be an adequate insulator in future generations of chip carrier substrates. Another disadvantage of using ceramics is that the conductors are formed by screen printing instead of photolithography. Therefore, feature sizes will not be as small as in conventional photolithographic methods, limiting the ability of the technology to keep up with improvements in silicon processing.

In addition, ceramic substrates are expensive when compared to organic substrates. Because feature sizes are larger in ceramic substrates, about 12 to about 15 ceramic layers (approximately 2 millimeters thick) must be used to accommodate the large number of input/output lines from the chip die to the chip carrier substrate. Furthermore, such a structure requires accommodation for land-side capacitors.

There are ceramic/organic substrates available in the market today. These are typically very expensive modules that integrate conventional ceramic technology with multilayer polyimide dielectric coatings. The dielectric coatings are either screen coated or spun on making the process very expensive and time consuming. Some existing ceramic substrates include a cavity on the top side of the substrate to accommodate the chip.

In view of the foregoing, there is a need for a method and apparatus to provide a high performance/low cost substrate, which is able to interface with a chip die without cracking. There is also a need for a method and apparatus to more easily accommodate capacitors without interfering with either a socket or surface mount technology (SMT) package interface to a motherboard.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION

A method and apparatus for a ceramic/organic hybrid chip carrier substrate is provided. In the following description, numerous specific details are set forth in order to provide a thorough understanding of embodiments of the present invention. It will be understood, however, to one skilled in the art, that these embodiments may be practiced without some or all of these specific details. In other instances, well-known process operations have not been described in detail in order not to unnecessarily obscure embodiments of the present invention.

Figure 1:
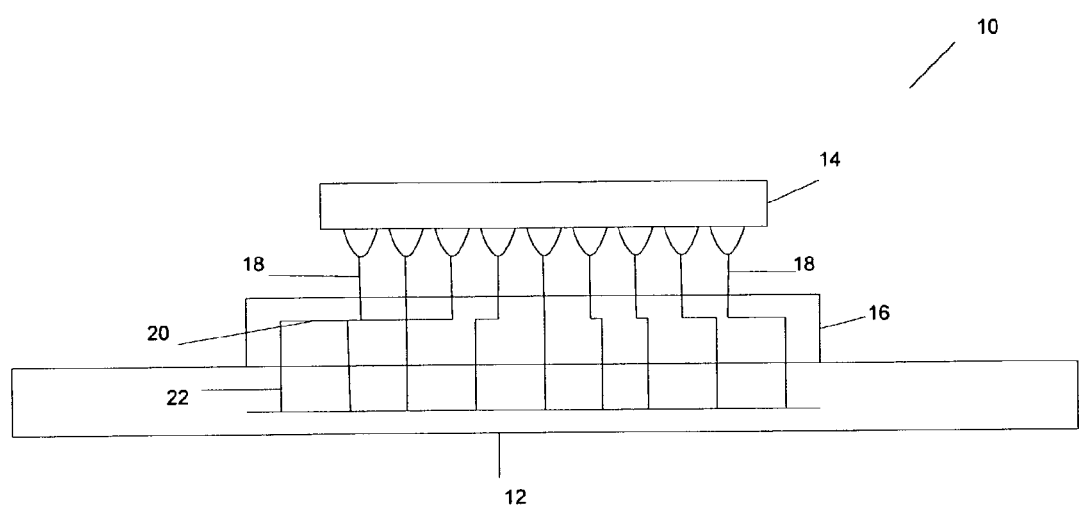
FIG. 1 illustrates a conventional semiconductor chip package connected to a motherboard.

FIG. 1 illustrates a conventional semiconductor chip package 10 connected to a motherboard 12. Chip package 10 includes a silicon IC (chip die) 14 attached to a chip carrier substrate 16 and electrically coupled to substrate 16 through a plurality of input/output (I/O) lines 18. Examples of a silicon chip die 14 include a microprocessor such as the Pentium® 4 processor from Intel Corporation (Santa Clara, Calif.). Substrate 16 also includes a plurality of interface vias 20 that couple to I/O lines 18. Interface vias 20 also couple substrate 16 to motherboard 12 through a plurality of conductive lines 22, which are typically known as chip pins. Chip package 10 is configured so that it may be easily connected to or disconnected from motherboard 12 through pins 22.

As shown in FIG. 1, interface vias 20 in chip carrier substrate 16 route the signal lines from chip die 14 (carried by conductive lines 18) to a wider pitch. The wider pitch enables pins 22 to be easier for the end user to connect to a socket that is standard in the motherboard industry. While the connection to the motherboard remains standard, I/O-power connection lines 18 are much denser. For example, currently there may be about 5,000 connection lines (e.g., I/O connections, power connections, ground connections, etc.) 18 in a very small area protruding from chip die 14. As described above, the pursuit of even greater speed in semiconductor technology will lead to designs having continually increasing I/O line density that may result in crosstalk and a greater need for ultra low-K dielectric insulation over conventional low-K dielectric insulation.

Figure 2:
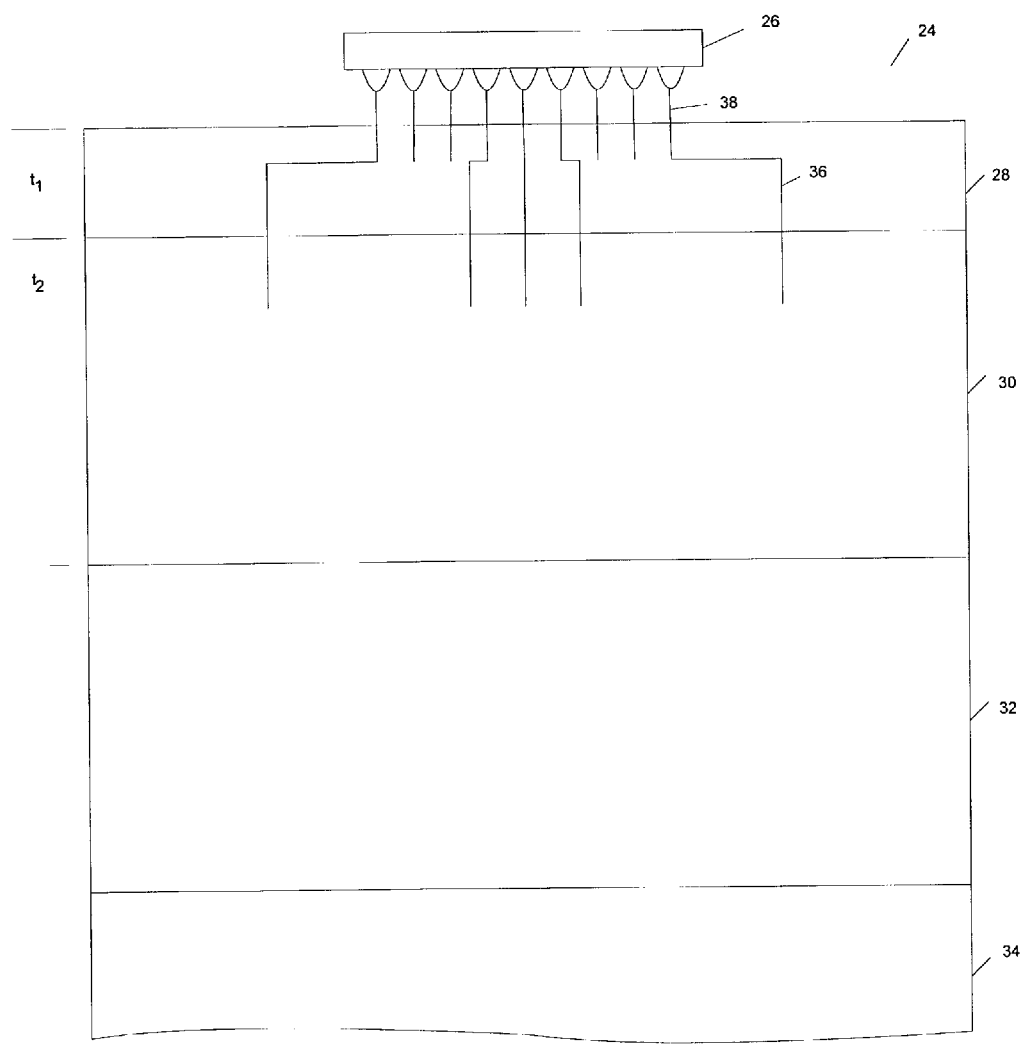
FIG. 2 illustrates a ceramic/organic hybrid chip carrier substrate coupled to a semiconductor chip die in accordance with one embodiment of the present invention.

FIG. 2 illustrates a ceramic/organic hybrid chip carrier substrate 24 coupled to a semiconductor IC (chip die) 26 in accordance with one embodiment of the present invention. Ceramic/organic hybrid substrate 24 includes one or more, thin, low dielectric-constant (lowK) epoxy layers 28 and a plurality of ceramic material layers 30, 32, and 34. In this embodiment, low-K epoxy layers 28 have a dielectric constant of less than 4.0 (and preferably 3.5 and lower). Also, in this embodiment, low-K epoxy layer 28 is a particle-filled, epoxy film available from Ajinomoto Co., Inc. (Japan) (ABF-Ajinomoto Buildup Film). Ceramic/organic hybrid substrate 24 also includes a plurality of interface vias 36 that are coupled to conductive lines 38, such as solder bumps, from chip die 26. Each low-K material layer 28 is preferably about 30 µm thick ($t_1$). Each of ceramic material layers 30, 32, and 34 are preferably about 150 µm thick ($t_2$), for a total ceramic layer thickness of about 450 µm. Ceramic/organic hybrid substrate 24 also includes a plurality of interface vias 36 that are coupled to conductive lines 38, such as flip chip solder bumps, from chip die 26.

In this embodiment, ceramic/organic hybrid substrate 24 takes advantage of the properties of the organic and ceramic materials. An advantage of the low-K epoxy film layer is the ease of manufacturing, in which it can be applied with a lamination process, instead of a liquid thin film as in a polyimide process. In addition, the low-K epoxy layer lamination process has a relatively low cost, has excellent electrical/mechanical properties, and may easily fit into the existing manufacturing processes. As previously discussed, the line density through a low-K, organic material can be much higher than that for a ceramic material. A low-K epoxy layer is able to have a line space of about 20 microns, while a ceramic material is able to support a line space of about 75 microns to about 100 microns. Newer organic materials may have even lower dielectric constants, making the difference between ceramic materials and organic materials even greater.

Therefore, according to this embodiment of the present invention, ceramic/organic hybrid substrate 24 takes advantage of the thin low-cost, low-K epoxy layer 28, by routing the dense circuitry from chip die 26 to ceramic material layer 30 as shown in FIG. 2. In addition, the use of low-K epoxy layer 28 may reduce the number of ceramic material layers required to about three layers, thus significantly reducing the cost of substrate 24. Low-K epoxy material layer 28 may be laminated onto ceramic material layer 30 to reduce throughput time and cost. Ceramic/organic hybrid substrate 24 may also take advantage of the properties of ceramic materials, which have a much more rigid structure than organic materials and a low CTE that works well with ultra low-K chip dies.

Figure 3A:
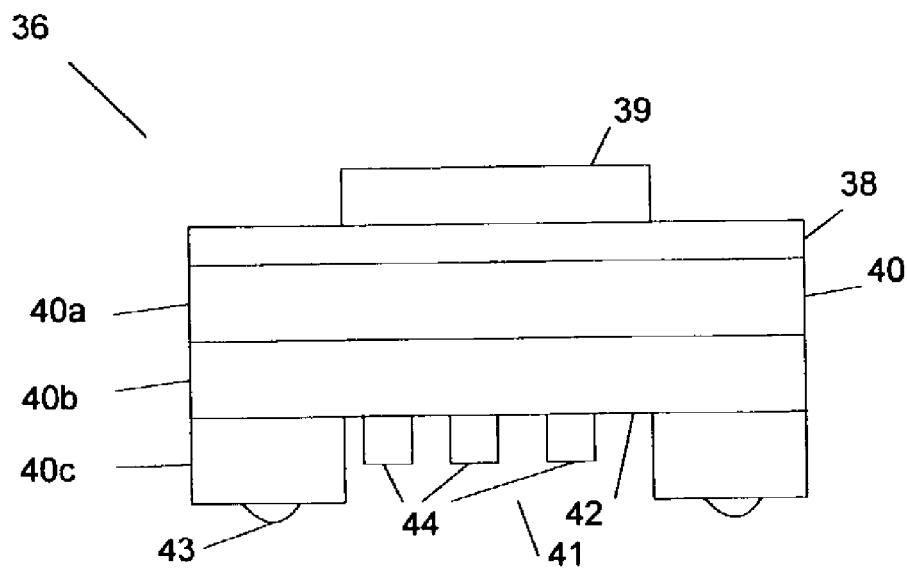
FIGS. 3a-b illustrates an inverted cavity ceramic/organic hybrid chip carrier substrate in accordance with one embodiment of the present invention.
Figure 3B:
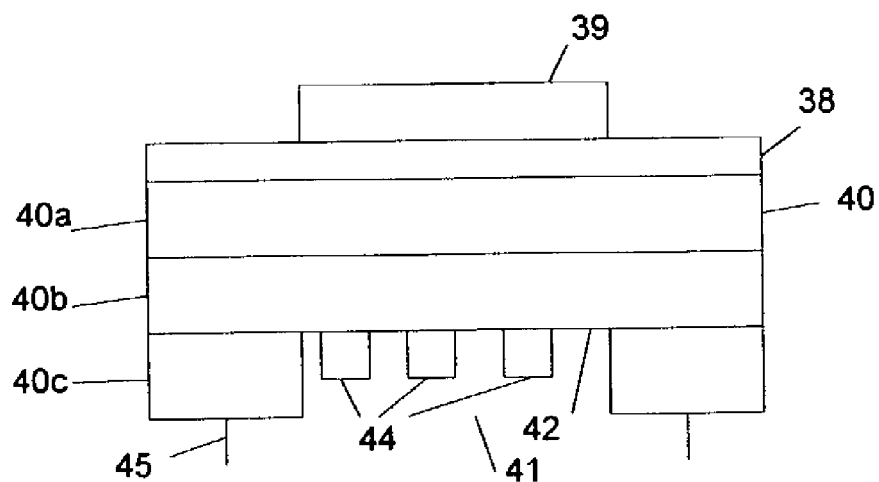

FIGS. 3a-b illustrate an inverted cavity ceramic/organic hybrid chip carrier substrate 36 in accordance with one embodiment of the present invention. Inverted cavity substrate 36 includes one or more low-K epoxy layers 38 disposed over a ceramic core 40. Ceramic core 40 includes an inner bottom surface 42 (the inverted cavity) that is recessed relative to an outer bottom surface. Chip capacitors 44 may then be mounted on inner bottom surface 42 to provide a low inductance path through inverted cavity substrate 36. In this embodiment, ceramic core 40 includes three ceramic material layers 40a, 40b, 40c. The third ceramic material layer 40c, positioned opposite chip die 39, includes a void 41 that creates the inverted cavity when ceramic material layers 40a-c are joined together (e.g., in a sintering process). The outer bottom surface may be coupled to solder 43 (as in FIG. 3a) for a surface mount to a motherboard. Alternatively, outer bottom surface may be coupled to pins 45 (as in FIG. 3b) for a socket mount to a motherboard.

Low-K epoxy layers 38 are used in inverted cavity substrate 36 to route dense circuitry from a semiconductor chip die 39 to ceramic core 40. By using a low-K epoxy layer, it is then not necessary to have a thick ceramic core and keeps the overall thickness low.

Referring to FIGS. 3a-b, inverted cavity 42 forms a "ceramic picture frame" to provide mounting for chip capacitors 44 so that land side capacitors 44 do not interfere with a socket or SMT (surface mount technology) mount. Accordingly, inverted cavity 42 eliminates the need for socket holes to accommodate the capacitors. In addition, eliminating part of the ceramic core 40 also provides for a shorter signal path between capacitors 44 and the chip die lowering parasitic inductance in the signal paths. For example, the signal path from the chip die 39 to capacitors mounted on the top side of the substrate 36 would typically have a length of 5 mm, while the signal path shown in FIGS. 3a-b is between 300 and 400 µm. Furthermore, the ceramic picture frame also provides better structural rigidity to inverted cavity substrate 36.

Yet another advantage of this embodiment of the present invention is that it provides for the use of a dry epoxy film dielectric instead of polyimide, which can be very expensive. Polyimide must be spun on in a small round shape, which is not cost effective. However, instead of being spun on as a wet coating, a dry epoxy film dielectric may be laminated on to the ceramic material layers. During the lamination process, the epoxy layer is adhered and cured onto the ceramic. This material and process decrease the throughput time and reduce the cost.

Figure 4:
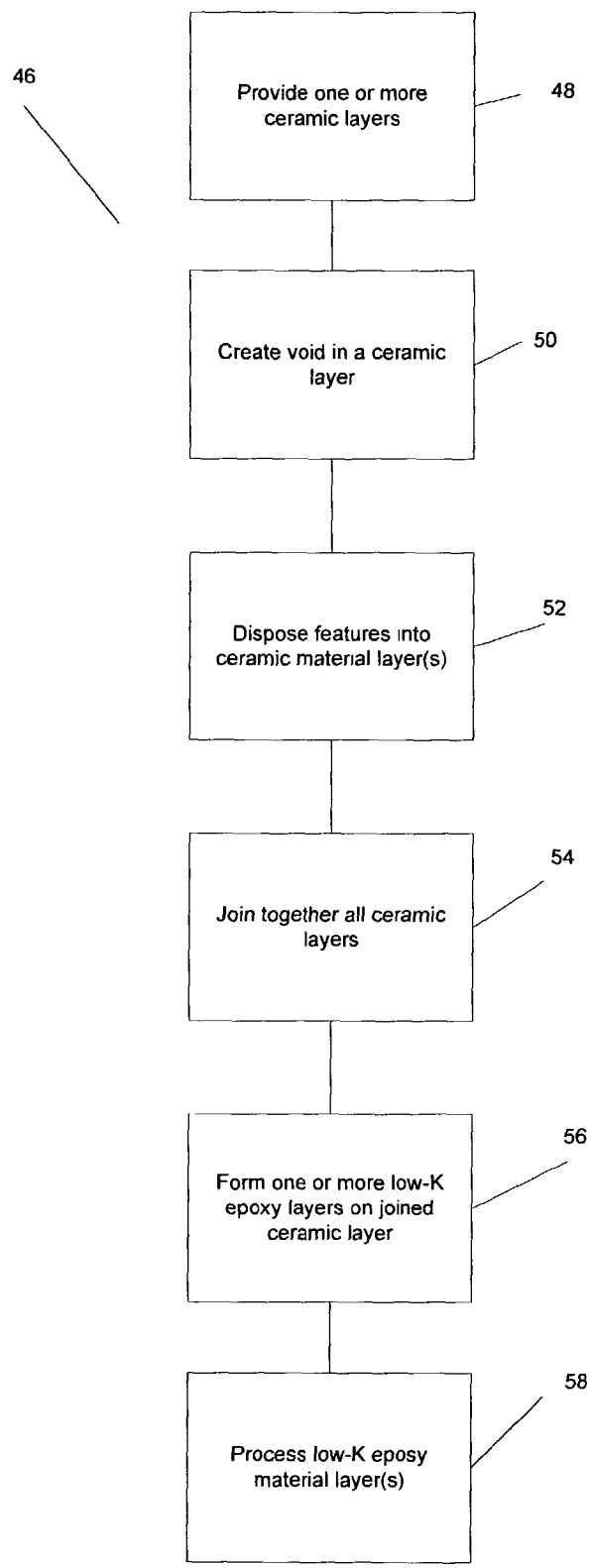
FIG. 4 illustrates a method for providing a semiconductor device in accordance with one embodiment of the present invention.

FIG. 4 illustrates a method 46 for providing a semiconductor device in accordance with one embodiment of the present invention. Method 46 begins at a block 48 where one or more ceramic material layers are provided. In this embodiment, three such layers are provided. In block 50, a void is created in one of the ceramic material layers (e.g., through a "punching" operation). In block 52, features are disposed onto the ceramic material layer, such as metalization using a screen printing process. In block 54, the ceramic material layers are joined together (e.g., in a sintering process). In block 56, one or more low-K epoxy layers are formed over the ceramic material layer, preferably using a dry film dielectric in a lamination process. In block 58, photolithography processes are used to process the low-K epoxy material layer(s) (e.g., by providing vias, and metalization patterns). In this embodiment, blocks 56 and 58 are repeated for as many low-K epoxy layers that are provided.

Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

What is claimed is:

1. A semiconductor package, comprising:
   at least one ceramic material layer comprising an inverted cavity to provide mounting for a plurality of spaced land-side chip capacitors wherein the at least one ceramic material layer is disposed between the plurality of spaced land-side chip capacitors and a chip die and wherein the landside surfaces of the plurality of spaced land-side chip capacitors are along the same plane, and wherein the arrangement of the plurality of spaced landside chip capacitors and the chip die provide for a signal path of approximately between 300 and 400 µm; and
   at least one low dielectric constant epoxy layer disposed over said at least one ceramic material layer, wherein said low dielectric constant epoxy layer is to be coupled to an integrated circuit; and wherein the low dielectric constant epoxy layer is an organic film that is laminated onto the ceramic material layer.

2. A semiconductor package as recited in claim 1, wherein the ceramic material layer includes three layers having a thickness of about 450 µm.

3. A semiconductor package as recited in claim 2, wherein the low dielectric constant epoxy layer has a thickness of about 30 µm.

4. A semiconductor package as recited in claim 3, wherein the low dielectric constant material supports a line space of about 20 microns and the ceramic material layer supports a line space between about 75 microns and about 100 microns.

5. A semiconductor package as recited in claim 3, wherein the ceramic material layer includes an inner bottom surface and an outer bottom surface, wherein said inner bottom surface is recessed relative to said outer bottom surface.

6. A semiconductor package as recited in claim 5, wherein the inner bottom surface is to support the at least one capacitor.

7. A semiconductor package as recited in claim 6, wherein said inner bottom surface is recessed from said outer bottom surface.

8. A semiconductor package, comprising:
   at least one ceramic material layer comprising an inverted cavity to provide mounting for a plurality of spaced land-side chip capacitors wherein the at least one ceramic material layer is disposed between the plurality of spaced land-side chip capacitors and a chip die, wherein an inner bottom surface of said ceramic material layer is recessed relative to an outer bottom surface of said ceramic material layer and wherein the landside surfaces of the plurality of spaced land-side chip capacitors are along the same plane, and wherein the arrangement of the plurality of spaced land-side chip capacitors and the chip die provide for a signal path of approximately between 300 and 400 µm;
   low dielectric constant epoxy layers disposed over said ceramic material layer; and
   an integrated circuit chip electrically coupled to said low dielectric constant epoxy layer wherein the low dielectric constant epoxy layer is an organic film that is laminated onto the top ceramic material layer.

9. A semiconductor package as recited in claim 8 wherein the plurality of spaced land-side chip capacitors are electrically coupled to the inner bottom surface of said ceramic material layer.

10. A semiconductor package as recited in claim 9 wherein said inner bottom surface of said ceramic material layer is recessed 150 µm from said outer bottom surface.

11. A semiconductor package as recited in claim 8, wherein the low dielectric constant epoxy layer has a thickness of about 30 µm.

12. A semiconductor package as recited in claim 11, wherein the low dielectric constant epoxy layer supports a line space of about 20 microns and the ceramic material layer supports a line space between about 75 microns and about 100 microns.

13. The semiconductor package as recited in claim 12 further comprising:
   a plurality of pins coupled to said outer bottom surface of said ceramic material layer.

14. The semiconductor package as recited in claim 13 further comprising:
   solder coupled to said outer bottom surface of said ceramic material layer.

* * * * *